United States Patent
Kaku et al.

(10) Patent No.: US 12,315,082 B2
(45) Date of Patent: May 27, 2025

(54) INFORMATION PROCESSING APPARATUS, NON-TRANSITORY COMPUTER READABLE MEDIUM, AND INFORMATION PROCESSING METHOD

(71) Applicant: TOYOTA JIDOSHA KABUSHIKI KAISHA, Toyota (JP)

(72) Inventors: Wataru Kaku, Musashino (JP); Daisuke Kikuchi, Yokohama (JP); Mina Funazukuri, Tokyo-to (JP); Aiko Sawado, Tokyo-to (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 334 days.

(21) Appl. No.: 18/098,380

(22) Filed: Jan. 18, 2023

(65) Prior Publication Data
US 2023/0230322 A1 Jul. 20, 2023

(30) Foreign Application Priority Data
Jan. 19, 2022 (JP) .................. 2022-006628

(51) Int. Cl.
*G06T 17/20* (2006.01)
*G06T 15/00* (2011.01)
(Continued)

(52) U.S. Cl.
CPC .............. *G06T 17/20* (2013.01); *G06T 15/00* (2013.01); *G06T 17/10* (2013.01); *G06T 19/00* (2013.01);
(Continued)

(58) Field of Classification Search
None
See application file for complete search history.

(56) References Cited

U.S. PATENT DOCUMENTS 6,476,803 B1 * 11/2002 Zhang ................ G06T 17/005
345/582
11,263,804 B1 * 3/2022 Bogacz ............... G06T 15/20
(Continued)

FOREIGN PATENT DOCUMENTS

CN 103198517 A 7/2013
CN 108171793 A * 6/2018 .......... G06T 17/005
(Continued)

OTHER PUBLICATIONS

Title: 3-D Modeling from Range Imagery: An Incremental Method with a Planning Component; Author: Reed et al.; pp. 99-111; Date: 1999; Source: https://www.cs.hunter.cuny.edu/~ioannis/3DP_F03/PAPERS/MODELING/REED_STAMOS/IVC99.pdf (Year: 1999).*

*Primary Examiner* — Jwalant Amin
(74) *Attorney, Agent, or Firm* — Dinsmore & Shohl LLP

(57) ABSTRACT

An information processing apparatus generates a stereoscopic image represented by a collection of polygons. The information processing apparatus includes a controller configured to acquire a plurality of distance images from a plurality of distance image sensors that capture an object, generate a plurality of 3D polygon models based on the plurality of distance images, divide a virtual space surrounding the object to generate a plurality of divided spaces, compare a number of vertices of polygons in the plurality of 3D polygon models in each divided space, select vertices of the 3D polygon model with a highest number of vertices in each divided space as vertices in the divided space, and integrate the selected vertices to generate the stereoscopic image.

8 Claims, 4 Drawing Sheets

(51) Int. Cl.
  *G06T 17/10*      (2006.01)
  *G06T 19/00*      (2011.01)
  *G06T 19/20*      (2011.01)
  G06F 30/00       (2020.01)
  H04N 13/221      (2018.01)
(52) U.S. Cl.
  CPC .............. *G06T 19/20* (2013.01); *G06F 30/00* (2020.01); *H04N 13/221* (2018.05)

(56) References Cited

U.S. PATENT DOCUMENTS

| | | |
|---|---|---|
| 2011/0316976 A1 | 12/2011 | Nakajima |
| 2012/0299919 A1* | 11/2012 | Sakurai ................. G06T 17/005 |
| | | 345/420 |
| 2013/0162631 A1 | 6/2013 | Chang et al. |
| 2021/0027527 A1 | 1/2021 | Yamamoto |
| 2023/0351696 A1* | 11/2023 | Lin .......................... G06T 19/20 |

FOREIGN PATENT DOCUMENTS

| | | |
|---|---|---|
| CN | 113449540 A | 9/2021 |
| JP | 2009545256 A | 12/2009 |
| JP | 4814441 B2 | 11/2011 |
| JP | 5067450 B2 | 11/2012 |
| JP | 6348623 B2 | 6/2018 |
| WO | 2008014301 A2 | 1/2008 |
| WO | 2019/167760 A1 | 9/2019 |

* cited by examiner

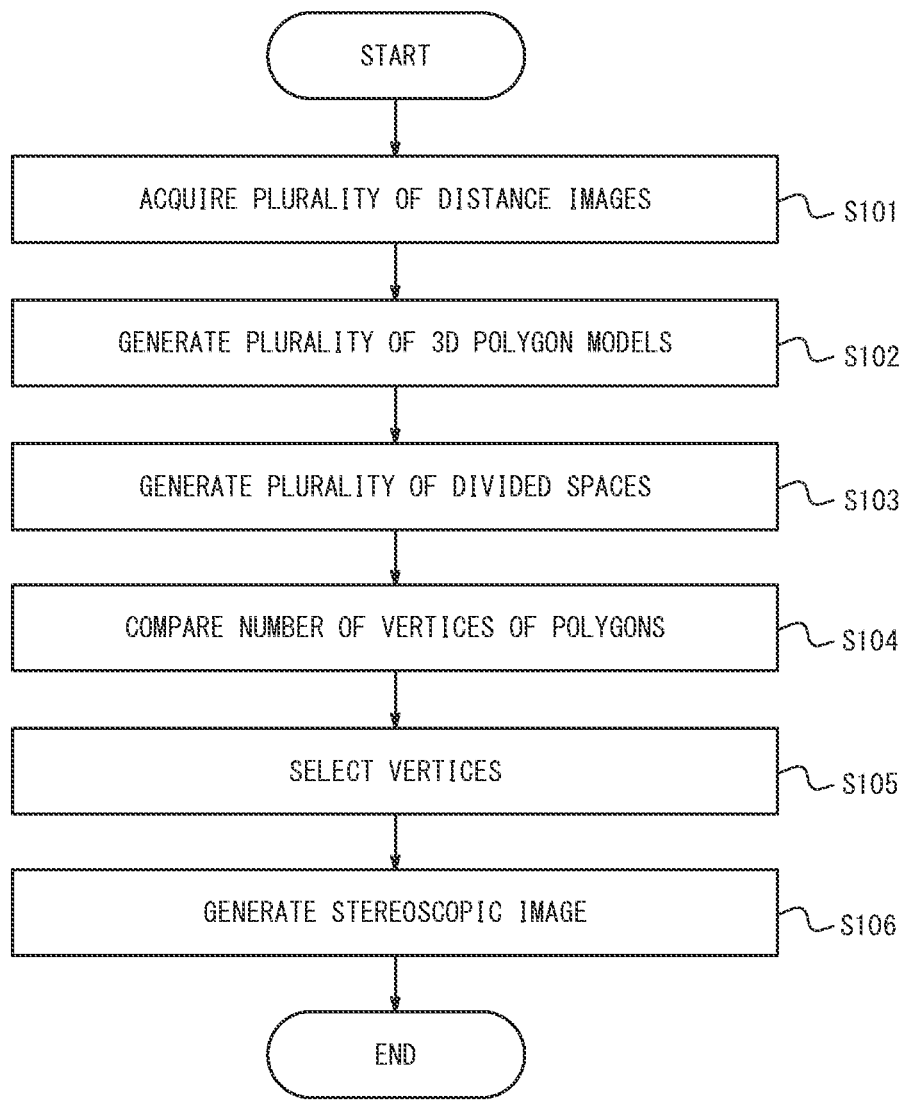

INFORMATION PROCESSING APPARATUS, NON-TRANSITORY COMPUTER READABLE MEDIUM, AND INFORMATION PROCESSING METHOD

CROSS-REFERENCE TO RELATED APPLICATION

This application claims priority to Japanese Patent Application No. 2022-006628 filed on Jan. 19, 2022, the entire contents of which are incorporated herein by reference.

TECHNICAL FIELD

The present disclosure relates to an information processing apparatus, a program, and an information processing method.

BACKGROUND

Technology for merging two images to generate an integrated image is known.

For example, Patent Literature (PTL) 1 discloses an apparatus for generating an integrated image by processing an image acquired with a first image sensor and an image acquired with a second image sensor whose position is adjusted with respect to the first image sensor.

CITATION LIST

Patent Literature

PTL 1: JP 2009-545256 A

SUMMARY

When images of an object are captured to generate a plurality of 3D polygon models, and the plurality of 3D polygon models are then integrated to generate a stereoscopic image, the degree of replication of the shape of the object might not be high.

It would be helpful to improve the degree of replication of the shape of an object when generating a stereoscopic image by integrating a plurality of 3D polygon models.

An information processing apparatus according to the present disclosure is an information processing apparatus for generating a stereoscopic image represented by a collection of polygons, the information processing apparatus including a controller configured to:
  acquire a plurality of distance images from a plurality of distance image sensors that capture an object;
  generate a plurality of 3D polygon models based on the plurality of distance images;
  divide a virtual space surrounding the object to generate a plurality of divided spaces;
  compare a number of vertices of polygons in the plurality of 3D polygon models in each divided space;
  select vertices of the 3D polygon model with a highest number of vertices in each divided space as vertices in the divided space; and
  integrate the selected vertices to generate the stereoscopic image.

A program according to the present disclosure is a program for generating a stereoscopic image represented by a collection of polygons, the program being configured to cause a computer to execute operations including:
  acquiring a plurality of distance images from a plurality of distance image sensors that capture an object;
  generating a plurality of 3D polygon models based on the plurality of distance images;
  dividing a virtual space surrounding the object to generate a plurality of divided spaces;
  comparing a number of vertices of polygons in the plurality of 3D polygon models in each divided space;
  selecting vertices of the 3D polygon model with a highest number of vertices in each divided space as vertices in the divided space; and
  integrating the selected vertices to generate the stereoscopic image.

An information processing method according to the present disclosure is an information processing method for an information processing apparatus configured to generate a stereoscopic image represented by a collection of polygons, the information processing method including:
  acquiring a plurality of distance images from a plurality of distance image sensors that capture an object;
  generating a plurality of 3D polygon models based on the plurality of distance images;
  dividing a virtual space surrounding the object to generate a plurality of divided spaces;
  comparing a number of vertices of polygons in the plurality of 3D polygon models in each divided space;
  selecting vertices of the 3D polygon model with a highest number of vertices in each divided space as vertices in the divided space; and
  integrating the selected vertices to generate the stereoscopic image.

According to the present disclosure, the degree of replication of the shape of an object can be improved when generating a stereoscopic image by integrating a plurality of 3D polygon models.

BRIEF DESCRIPTION OF THE DRAWINGS

In the accompanying drawings:

FIG. 4 is a flowchart illustrating operations of an information processing system according to an embodiment of the present disclosure.

DETAILED DESCRIPTION

An embodiment of the present disclosure is described below with reference to the drawings.

Figure 1:
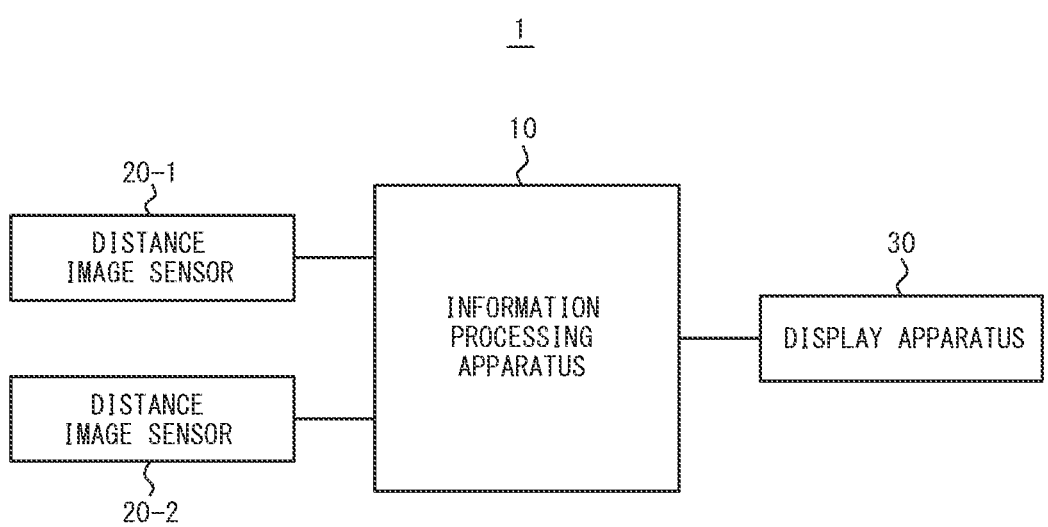
FIG. 1 is a diagram illustrating a configuration of an information processing system according to an embodiment of the present disclosure.

FIG. 1 is a diagram illustrating a configuration of an information processing system 1 according to an embodiment of the present disclosure. The configuration and outline of the information processing system 1 according to an embodiment of the present disclosure are described with reference to FIG. 1.

An information processing system 1 includes an information processing apparatus 10, distance image sensors 20-1, 20-2, and a display apparatus 30.

The information processing apparatus 10 and the distance image sensors 20-1, 20-2 are communicably connected. The information processing apparatus 10 and the distance image sensors 20-1, 20-2 may be communicably connected in a wired or wireless manner.

The information processing apparatus 10 and the display apparatus 30 are communicably connected. The information processing apparatus 10 and the display apparatus 30 may be communicably connected in a wired or wireless manner.

Hereafter, when no particular distinction is necessary, the distance image sensors 20-1, 20-2 may be referred to simply as the distance image sensor 20.

FIG. 1 illustrates a case in which the information processing system 1 includes two distance image sensors 20, but the number of distance image sensors 20 included in the information processing system 1 is not limited to two. It suffices for the information processing system 1 to include a plurality of distance image sensors 20. In the present embodiment, a case in which the number of distance image sensors 20 included in the information processing system 1 is two will be described as an example.

The distance image sensor 20 is a sensor capable of capturing an object and generating a distance image. A distance image is an image with image information and distance information. For each pixel in the image, the distance image has image information and information on the distance from the distance image sensor 20 to the object in the portion corresponding to the pixel. The distance image sensor 20 may be any sensor capable of generating distance images.

A non-limiting example of the object to be captured by the distance image sensor 20 is a human body.

The information processing apparatus 10 may be a general purpose personal computer (PC) or a dedicated computer configured to function as the information processing apparatus 10 in the information processing system 1.

The information processing apparatus 10 can generate 3D polygon models based on the distance images acquired from the distance image sensors 20. A 3D polygon model is a model that represents a three-dimensional object by a collection of polygons. Polygons are polygonal shapes, such as triangles or quadrilaterals. The information processing apparatus 10 may generate the 3D polygon models based on distance images using any conventionally known algorithm.

The information processing apparatus 10 generates a 3D polygon model of the object captured by the distance image sensor 20-1 based on the distance image acquired from the distance image sensor 20-1. The 3D polygon model generated by the information processing apparatus 10 based on the distance image acquired from the distance image sensor 20-1 is also referred to below as the "first 3D polygon model".

The information processing apparatus 10 generates a 3D polygon model of the object captured by the distance image sensor 20-2 based on the distance image acquired from the distance image sensor 20-2. The 3D polygon model generated by the information processing apparatus 10 based on the distance image acquired from the distance image sensor 20-2 is also referred to below as the "second 3D polygon model".

The distance image sensor 20-1 and the distance image sensor 20-2 are arranged at different positions. This enables the information processing apparatus 10 to generate a plurality of 3D polygon models based on distance images of the object captured from a plurality of different positions. If there were only one distance image sensor 20, the range of the object to be captured would be limited, but with a plurality of distance image sensors 20 arranged at different positions, the distance image sensors 20-1, 20-2 can capture the object from various angles.

The information processing apparatus 10 integrates the first 3D polygon model with the second 3D polygon model to generate a stereoscopic image. The stereoscopic image generated by the information processing apparatus 10 is a stereoscopic image represented by a collection of polygons, like the 3D polygon models. Details of the process by which the information processing apparatus 10 integrates the first 3D polygon model with the second 3D polygon model to generate a stereoscopic image are provided below.

The information processing apparatus 10 transmits the generated stereoscopic image to the display apparatus 30.

The display apparatus 30 may be a liquid crystal display, an organic Electro-Luminescence (EL) display, an inorganic EL display, or the like. Alternatively, the display apparatus 30 need not be limited to an apparatus only with a display function and may be an information communication terminal such as a smartphone, tablet, or general purpose PC.

The display apparatus 30 can display stereoscopic images acquired from the information processing apparatus 10.

Figure 2:
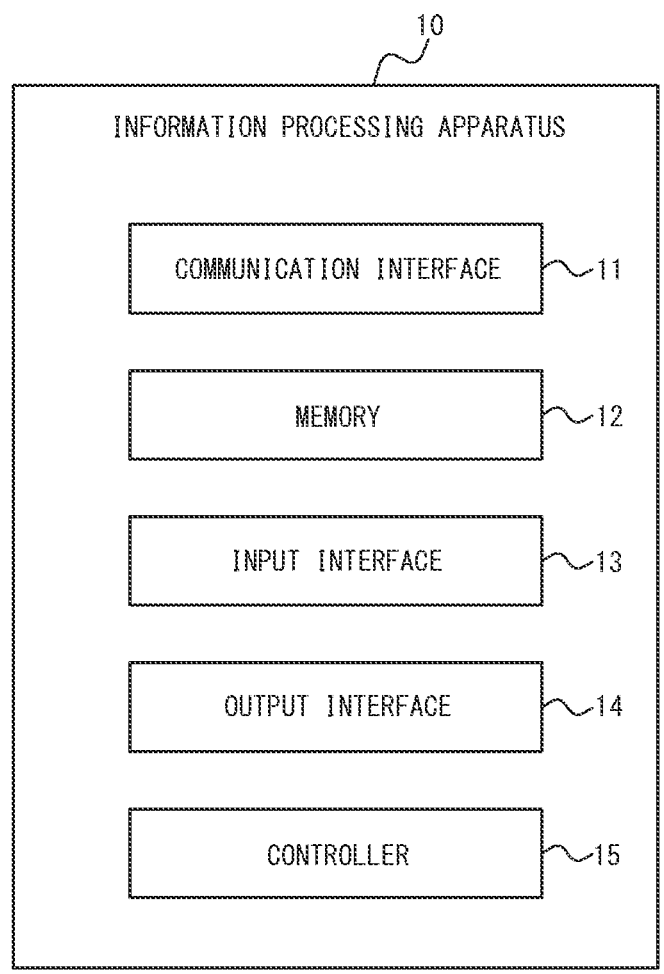
FIG. 2 is a block diagram illustrating a configuration of an information processing apparatus according to an embodiment of the present disclosure.

A configuration of the information processing apparatus 10 according to an embodiment of the present disclosure is described with reference to FIG. 2.

The information processing apparatus 10 includes a communication interface 11, a memory 12, an input interface 13, an output interface 14, and a controller 15.

The communication interface 11 includes a communication module. The communication interface 11 may include a communication module compliant with a wired communication standard. The communication interface 11 may include a communication module compliant with a wireless communication standard. The communication interface 11 can communicate with the distance image sensors 20 and the display apparatus 30.

The memory 12 is, for example, a semiconductor memory, a magnetic memory, an optical memory, or the like, but is not limited to these. The memory 12 may function as, for example, a main memory, an auxiliary memory, or a cache memory. The memory 12 stores any information used for operations of the information processing apparatus 10. For example, the memory 12 may store a system program, an application program, various types of information received by the communication interface 11, and the like. A portion of the memory 12 may be installed externally to the information processing apparatus 10. In this case, the externally installed portion of the memory 12 may be connected to the information processing apparatus 10 via any appropriate interface.

The input interface 13 includes one or more input interfaces for detecting user input and acquiring input information based on user operation. For example, the input interface 13 includes, but is not limited to, a physical key, a capacitive key, a touch screen integrally provided with a display of the output interface 14, or a microphone that receives audio input.

The output interface 14 includes one or more output interfaces for outputting information to notify the user. For example, the output interface 14 includes, but is not limited to, a display for outputting information as images, a speaker for outputting information as audio, or the like.

The controller 15 includes at least one processor, at least one dedicated circuit, or a combination thereof. The processor is a general purpose processor, such as a central processing unit (CPU) or a graphics processing unit (GPU), or a dedicated processor specialized for particular processing. The dedicated circuit is, for example, a field-programmable gate array (FPGA) or an application specific integrated circuit (ASIC). The controller 15 executes processes related to operations of the information processing apparatus 10 while controlling components of the information processing apparatus 10.

(Operations of Information Processing System)

Operations of the information processing system 1 illustrated in FIG. 1 are described with reference to FIGS. 1 and 2.

The distance image sensors 20-1, 20-2 each capture a distance image of an object. The distance image sensors 20-1, 20-2 transmit the captured distance images to the information processing apparatus 10. The object captured by the distance image sensors 20-1, 20-2 may, for example, be a human body.

The communication interface 11 of the information processing apparatus 10 receives the distance image transmitted by the distance image sensor 20-1. The controller 15 acquires the distance image transmitted by the distance image sensor 20-1 via the communication interface 11. The communication interface 11 receives the distance image transmitted by the distance image sensor 20-2. The controller 15 acquires the distance image transmitted by the distance image sensor 20-2 via the communication interface 11.

The controller 15 generates a plurality of 3D polygon models based on the distance images acquired from the plurality of distance image sensors 20. That is, the controller 15 generates a first 3D polygon model based on the distance image acquired from the distance image sensor 20-1. The controller 15 generates a second 3D polygon model based on the distance image acquired from the distance image sensor 20-2.

The controller 15 generates a virtual space surrounding the object. The range of the virtual space depends on the shape of the object. Since the virtual space surrounds the entire object, the range of the virtual space increases in a case in which the object is large and decreases in a case in which the object is small.

The controller 15 divides the virtual space surrounding the object to generate a plurality of divided spaces. The divided spaces generated by the controller 15 dividing the virtual space may be of any shape. For example, the shape of the divided space may be a cube. Alternatively, the divided space may be rectangular, for example.

The plurality of divided spaces may all have the same shape or may have a mixture of different shapes. The plurality of divided spaces may all be the same size or may be a mixture of different sizes.

For each divided space, the controller 15 compares the number of vertices of polygons in the plurality of 3D polygon models in the divided space.

In a case in which the first 3D polygon model and the second 3D polygon model are generated based on the distance images acquired from the two distance image sensors 20-1, 20-2, the controller 15 compares, for each divided space, the number of vertices of polygons in the first 3D polygon model and the number of vertices of polygons in the second 3D polygon model located in the divided space.

For each divided space, the controller 15 selects the vertices of the 3D polygon model with the highest number of vertices as the vertices in that divided space. For example, in a case in which, in a given divided space, the first 3D polygon model has more vertices of polygons located within that divided space than the second 3D polygon model does, the controller 15 selects the vertices of the first 3D polygon model as the vertices in that divided space.

The controller 15 executes the process of selecting the vertices of the 3D polygon model in all of the divided spaces generated by dividing the virtual space.

The controller 15 integrates the selected vertices to produce a stereoscopic image represented by a collection of polygons. The controller 15 can thus integrate the first 3D polygon model with the second 3D polygon model to generate a stereoscopic image.

Figure 3:
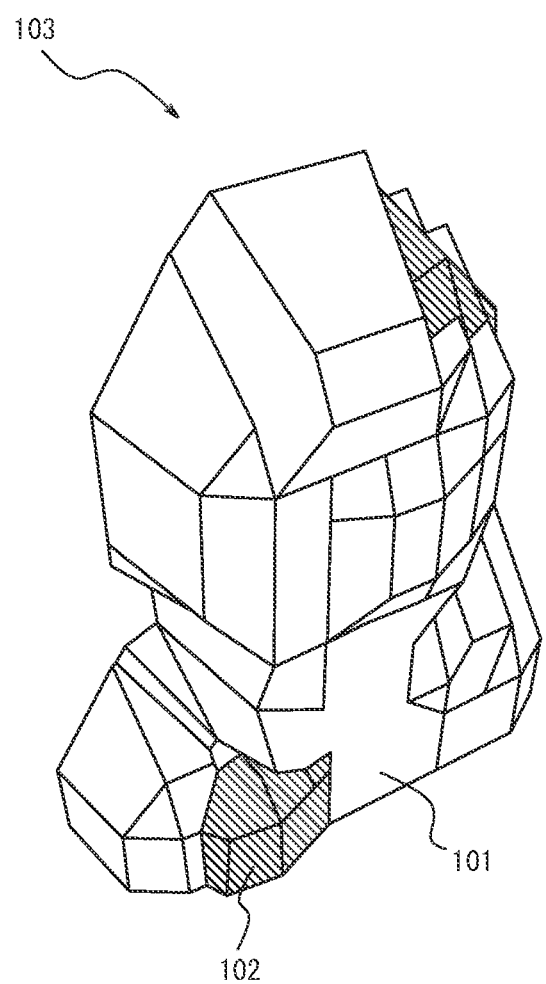
FIG. 3 is a diagram illustrating how two 3D polygon models are integrated to generate a stereoscopic image.

FIG. 3 illustrates an example of how the controller 15 integrates the first 3D polygon model 101 with the second 3D polygon model 102 to generate a stereoscopic image 103.

By thus selecting the vertices of the 3D polygon model with the highest number of vertices in each divided space and generating an integrated stereoscopic image, the information processing apparatus 10 can generate a smooth stereoscopic image and improve the degree of replication of the shape of the object.

The controller 15 transmits the generated stereoscopic image to the display apparatus 30 via the communication interface 11.

The display apparatus 30 receives the stereoscopic image transmitted by the information processing apparatus 10 and displays the received stereoscopic image.

Operations of the information processing system 1 are described with reference to the flowchart in FIG. 4.

In step S101, the controller 15 of the information processing apparatus 10 acquires a plurality of distance images from the plurality of distance image sensors 20-1, 20-2.

In step S102, the controller 15 generates a plurality of 3D polygon models based on the plurality of distance images. In greater detail, the controller 15 generates a first 3D polygon model based on the distance image acquired from the distance image sensor 20-1. The controller 15 also generates a second 3D polygon model based on the distance image acquired from the distance image sensor 20-2.

In step S103, the controller 15 divides the virtual space surrounding the object to generate a plurality of divided spaces.

In step S104, for each divided space, the controller 15 compares the number of vertices of polygons in the plurality of 3D polygon models in the divided space.

In step S105, for each divided space, the controller 15 selects the vertices of the 3D polygon model with the highest number of vertices as the vertices in that divided space.

In step S106, the controller 15 integrates the selected vertices to produce a stereoscopic image represented by a collection of polygons.

(First Variation)

When selecting the vertices in each divided space, the controller 15 of the information processing apparatus 10 may select not only the vertices of the 3D polygon model with the highest number of vertices, but also other vertices.

For example, for each divided space, the controller 15 may also select the vertices of the 3D polygon model with a number of vertices equal to or greater than a first threshold as the vertices in the divided space. The first threshold may be a predetermined value set in advance and may be stored in the memory 12.

For example, suppose that the 3D polygon model with the highest number of vertices in a certain divided space is the first 3D polygon model. In this case, the controller 15 selects the vertices of the first 3D polygon model as the vertices in that divided space. In a case in which the first threshold is 10, and the number of vertices of the second 3D polygon model is 10 or more in that divided space, then the controller 15 may also select the vertices of the second 3D polygon model in addition to the vertices of the first 3D polygon model.

In this way, by the controller 15 also selecting the vertices of a 3D polygon model with a number of vertices equal to or greater than the first threshold as vertices in the divided space, the information processing apparatus 10 can generate a smoother stereoscopic image.

(Second Variation)

The controller 15 of the information processing apparatus 10 may select vertices other than the vertices illustrated in the first variation as selected vertices in each divided space in addition to the vertices of the 3D polygon model with the highest number of vertices.

For example, for each divided space, the controller 15 may also select the vertices of the 3D polygon model with a number of vertices differing by less than a second threshold from the number of vertices of the 3D polygon model with the highest number of vertices as the vertices in the divided space. The second threshold may be a predetermined value set in advance and may be stored in the memory 12.

For example, suppose that the 3D polygon model with the highest number of vertices in a certain divided space is the first 3D polygon model. In this case, the controller 15 selects the vertices of the first 3D polygon model as the vertices in that divided space. In a case in which the second threshold is five, and the difference between the number of vertices of the first 3D polygon model and the number of vertices of the second 3D polygon model is less than five, then the controller 15 may also select the vertices of the second 3D polygon model in addition to the vertices of the first 3D polygon model.

In this way, by the controller 15 also selecting the vertices of a 3D polygon model with a number of vertices differing by less than a second threshold from the number of vertices of the 3D polygon model with the highest number of vertices as vertices in the divided space, the information processing apparatus 10 can generate a smoother stereoscopic image.

As described above, in the information processing apparatus 10 according to the present embodiment, the controller 15 compares the number of vertices of polygons of the plurality of 3D polygon models in each divided space, selects the vertices of the 3D polygon model with the highest number of vertices in each divided space as the vertices in the divided space, and integrates the selected vertices to generate a stereoscopic image. This enables the information processing apparatus 10 to select the vertices of a 3D polygon model with a high density of vertices in each divided space and generate a smooth stereoscopic image as an integrated stereoscopic image. According to the information processing apparatus 10 of the present embodiment, the degree of replication of the shape of an object can therefore be improved when generating a stereoscopic image by integrating a plurality of 3D polygon models.

The present disclosure is not limited to the embodiment described above. For example, a plurality of blocks described in the block diagrams may be integrated, or a block may be divided. Instead of executing a plurality of steps described in the flowcharts in chronological order in accordance with the description, the plurality of steps may be executed in parallel or in a different order according to the processing capability of the apparatus that executes each step, or as required. Other modifications can be made without departing from the spirit of the present disclosure.

For example, some processing operations performed in the information processing apparatus 10 in the above embodiment may be performed in the distance image sensors 20 or the display apparatus 30. For example, some of the processing operations performed in the distance image sensors 20 or the display apparatus 30 in the above embodiment may be performed in the information processing apparatus 10.

For example, in the above embodiment, the information processing apparatus 10 and distance image sensors 20 are described as independent apparatuses, but the information processing apparatus 10 and the distance image sensors 20 may be integrated apparatuses. For example, in the above embodiment, the information processing apparatus 10 and the display apparatus 30 are described as independent apparatuses, but the information processing apparatus 10 and the display apparatus 30 may be integrated apparatuses.

For example, a configuration that causes a general purpose electronic device such as a smartphone, a computer, or the like to function as the information processing apparatus 10 according to the embodiment described above is possible. Specifically, a program in which processes for realizing the functions of the information processing apparatus 10 or the like according to the embodiment are written may be stored in a memory of the electronic device, and the program may be read and executed by a processor of the electronic device. Accordingly, in an embodiment, the present disclosure can also be implemented as a program executable by a processor.

For example, in the above embodiment, the case of the information processing system 1 including two distance image sensors 20 has been described as an example, but the number of distance image sensors 20 in the information processing system 1 may be any number that is two or more.

For example, in the above embodiment, the case of a human body being the object captured by the distance image sensors 20 has been described as an example, but the object may be an object other than a human body.

The invention claimed is:

1. An information processing apparatus for generating a stereoscopic image represented by a collection of polygons, the information processing apparatus comprising a controller configured to:
    acquire a plurality of distance images from a plurality of distance image sensors that capture an object;
    generate a plurality of 3D polygon models based on the plurality of distance images;
    divide a virtual space surrounding the object to generate a plurality of divided spaces;
    compare a number of vertices of polygons in the plurality of 3D polygon models in each divided space;
    select vertices of the 3D polygon model with a highest number of vertices in each divided space as vertices in the divided space; and
    integrate the selected vertices to generate the stereoscopic image.

2. The information processing apparatus according to claim 1, wherein the controller is configured also to select vertices of the 3D polygon model, in the divided space, with a number of vertices equal to or greater than a first threshold as vertices in the divided space.

3. The information processing apparatus according to claim 1, wherein the controller is configured also to select vertices of the 3D polygon model, in the divided space, with a number of vertices differing by less than a second threshold from the number of vertices of the 3D polygon model with the highest number of vertices as vertices in the divided space.

4. The information processing apparatus according to claim 1, wherein a range of the virtual space depends on a shape of the object.

5. The information processing apparatus according to claim 1, wherein the object is a human body.

6. The information processing apparatus according to claim 1, wherein the divided space is a cube.

7. A non-transitory computer readable medium storing a program for generating a stereoscopic image represented by a collection of polygons, the program being configured to cause a computer to execute operations comprising:
- acquiring a plurality of distance images from a plurality of distance image sensors that capture an object;
- generating a plurality of 3D polygon models based on the plurality of distance images;
- dividing a virtual space surrounding the object to generate a plurality of divided spaces;
- comparing a number of vertices of polygons in the plurality of 3D polygon models in each divided space;
- selecting vertices of the 3D polygon model with a highest number of vertices in each divided space as vertices in the divided space; and
- integrating the selected vertices to generate the stereoscopic image.

8. An information processing method for an information processing apparatus configured to generate a stereoscopic image represented by a collection of polygons, the information processing method comprising:
- acquiring a plurality of distance images from a plurality of distance image sensors that capture an object;
- generating a plurality of 3D polygon models based on the plurality of distance images;
- dividing a virtual space surrounding the object to generate a plurality of divided spaces;
- comparing a number of vertices of polygons in the plurality of 3D polygon models in each divided space;
- selecting vertices of the 3D polygon model with a highest number of vertices in each divided space as vertices in the divided space; and
- integrating the selected vertices to generate the stereoscopic image.

* * * * *